US010204877B2

(12) United States Patent
Arvin et al.

(10) Patent No.: US 10,204,877 B2
(45) Date of Patent: *Feb. 12, 2019

(54) CORROSION RESISTANT ALUMINUM BOND PAD STRUCTURE

(71) Applicant: INTERNATIONAL BUSINESS MACHINES CORPORATION, Armonk, NY (US)

(72) Inventors: Charles L. Arvin, Poughkeepsie, NY (US); Jeffrey P. Gambino, Portland, OR (US); Charles F. Musante, Burlington, VT (US); Christopher D. Muzzy, Burlington, VT (US); Wolfgang Sauter, Burke, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/899,755

(22) Filed: Feb. 20, 2018

(65) Prior Publication Data
US 2018/0174988 A1 Jun. 21, 2018

Related U.S. Application Data

(62) Division of application No. 14/752,115, filed on Jun. 26, 2015, now Pat. No. 9,953,940.

(51) Int. Cl.
*H01L 23/00* (2006.01)
*C22C 21/00* (2006.01)

(52) U.S. Cl.
CPC ............. *H01L 24/05* (2013.01); *C22C 21/00* (2013.01); *H01L 24/45* (2013.01); *H01L 24/03* (2013.01); *H01L 24/48* (2013.01); *H01L 2224/03009* (2013.01); *H01L 2224/0345* (2013.01); *H01L 2224/03452* (2013.01); *H01L 2224/04042* (2013.01); *H01L 2224/05025* (2013.01); *H01L 2224/05083* (2013.01);
(Continued)

(58) Field of Classification Search
CPC ........ H01L 24/05; H01L 24/03; H01L 24/45; H01L 2224/03452; H01L 2224/04042; H01L 2224/05025; H01L 2224/05083; H01L 2224/05099; H01L 2224/4502
USPC ........ 257/773, 774, 762, 765; 438/106, 601; 359/267
See application file for complete search history.

(56) References Cited

U.S. PATENT DOCUMENTS 4,561,009 A * 12/1985 Yonezawa ......... H01L 21/02142
257/762
4,907,734 A 3/1990 Conru et al.
(Continued)

OTHER PUBLICATIONS

Simon Thomas et al., "Micro-Corrosion of Al—Cu Bonding Pads", IEEE Transaction on Components, Hybrids, and Manufacturing Technology, Jun. 1987, pp. 252-257, vol. CHMT-10, No. 2.
(Continued)

*Primary Examiner* — Mohammed Shamsuzzaman
(74) *Attorney, Agent, or Firm* — Steven Meyers; Andrew M. Calderon; Roberts Mlotkowski Safran Cole & Calderon, P.C.

(57) ABSTRACT

A method of manufacturing a bond pad structure may include depositing an aluminum-copper (Al—Cu) layer over a dielectric layer; and depositing an aluminum-chromium (Al—Cr) layer directly over the Al—Cu layer.

19 Claims, 2 Drawing Sheets

(52) U.S. Cl.
CPC .............. *H01L 2224/05099* (2013.01); *H01L 2224/05583* (2013.01); *H01L 2224/05624* (2013.01); *H01L 2224/05671* (2013.01); *H01L 2224/4502* (2013.01); *H01L 2224/48463* (2013.01)

(56) References Cited

U.S. PATENT DOCUMENTS

| | | | |
|---|---|---|---|
| 5,134,460 | A | 7/1992 | Brady et al. |
| 5,393,703 | A * | 2/1995 | Olowolafe ........ H01L 21/76838 |
| | | | 257/765 |
| 5,565,378 | A * | 10/1996 | Harada ................. H01L 21/321 |
| | | | 228/180.5 |
| 5,897,370 | A | 4/1999 | Joshi et al. |
| 6,297,160 | B1 | 10/2001 | Chien |
| 6,451,681 | B1 * | 9/2002 | Greer ...................... H01L 24/13 |
| | | | 257/E21.508 |
| 6,531,384 | B1 * | 3/2003 | Kobayashi .............. H01L 24/03 |
| | | | 257/E23.02 |
| 6,620,720 | B1 | 9/2003 | Moyer et al. |
| 7,276,797 | B2 * | 10/2007 | Fan ......................... H01L 24/03 |
| | | | 257/774 |
| 7,470,997 | B2 | 12/2008 | Lin et al. |
| 7,528,536 | B2 | 5/2009 | Hanson |
| 7,800,239 | B2 | 9/2010 | Dalal et al. |
| 2003/0057559 | A1 * | 3/2003 | Mis ......................... H01L 23/50 |
| | | | 257/762 |
| 2011/0267673 | A1 * | 11/2011 | Agrawal ................. G02F 1/155 |
| | | | 359/267 |
| 2016/0379948 | A1 | 12/2016 | Arvin et al. |

OTHER PUBLICATIONS

Rick Brownson et al., "The Role of RIE in Microchip Bond Pad Corrosion", SPIE, pp. 95-102, vol. 2874, Austin, Texas.
Takamaor Kikkawa et al., "A Quarter-Micrometer Interconnection Technology Using a TiN/Al—Si—Cu/TiN/Al—Si—Cu/TiN/Ti Multilayer Structure", IEEE, Feb. 1993, vol. 40, Issue 2, abstract.
Unknown, "The Nordic Electronics Packaging Guideline", 25 pages, uploaded from http://extra.ivf.se/ngl/documents/ChapterA/chapterA.pdf, date unknown.
Kikkawa et al., "A Quarter-Micrometer Interconnection Technology Using a TiN/Al—Si—Cu/TiN/Al—Si—Cu/TiN/Ti Multilayer Structure", IEEE Transactions on Electron Devices, vol. 40, No. 2, Feb. 1993, pp. 296-302.
List of IBM Patents or Patent Applications Treated as Related 1 page.

* cited by examiner

CORROSION RESISTANT ALUMINUM BOND PAD STRUCTURE

FIELD OF THE INVENTION

The invention relates to semiconductor structures and, more particularly, to bond pad structures and methods of manufacture.

BACKGROUND

Bond pads are used to bond bonding wires to a semiconductor device, e.g., an integrated circuit. Aluminum bond pad corrosion is a common occurrence in the fabrication of aluminum-copper (Al—Cu) bond pads. One particular corrosion mechanism is galvanic corrosion, which happens when a metal alloy (such as Al—Cu) is exposed to processing chemicals and/or atmospheric moisture. The corrosion may degrade conductive and/or bonding performance of the bond pad, and may also lead to other types of reliability problems in the semiconductor device.

SUMMARY

In an aspect of the invention, a method of manufacturing a bond pad structure includes depositing an aluminum-copper (Al—Cu) layer over a dielectric layer; and; depositing an aluminum-chromium (Al—Cr) layer directly over the Al—Cu layer.

In an aspect of the invention, a method of manufacturing a bond pad structure includes depositing a titanium-nitride (TiN) layer over a via formed in a dielectric layer; depositing an aluminum-copper (Al—Cu) layer directly over the TiN layer; and depositing an aluminum-chromium (Al—Cr) layer directly over the Al—Cu layer.

In an aspect of the invention, a structure includes a titanium-nitride (TiN) layer deposited over a dielectric layer; an aluminum-copper (Al—Cu) layer deposited directly over the TiN layer; and an aluminum-chromium (Al—Cr) layer deposited directly over the Al—Cu layer.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to bond pad structures and methods of manufacture. More specifically, the present invention relates to aluminum-copper (Al—Cu) bond pad structures having a protective chromium alloy layer, e.g., an aluminum-chromium (Al—Cr) layer.

An Al—Cu bond pad structure having a protective chromium alloy layer prevents corrosion, e.g., galvanic corrosion, during the fabrication of the bond pad, and hence, prevents corrosion from degrading conductive and/or bonding performance of the bond pad. In embodiments, the bond pad structure in accordance with aspects of the present invention prevents copper from migrating to a top surface of the bond pad. As a result of preventing corrosion, the bond pad structure with the protective chromium alloy layer is more reliable than conventional bond pad structures.

The bond pad structure of the present invention can be manufactured in a number of ways using a number of different tools. In general, though, the methodologies and tools are used to form structures with dimensions in the micrometer and nanometer scale. The methodologies, i.e., technologies, employed to manufacture the bond pad structure of the present invention have been adopted from integrated circuit (IC) technology. For example, the structures of the present invention are built on wafers and are realized in films of material patterned by photolithographic processes on the top of a wafer. In particular, the fabrication of the bond pad structure of the present invention uses three basic building blocks: (i) deposition of thin films of material on a substrate, (ii) applying a patterned mask on top of the films by photolithographic imaging, and (iii) etching the films selectively to the mask.

Figure 1:
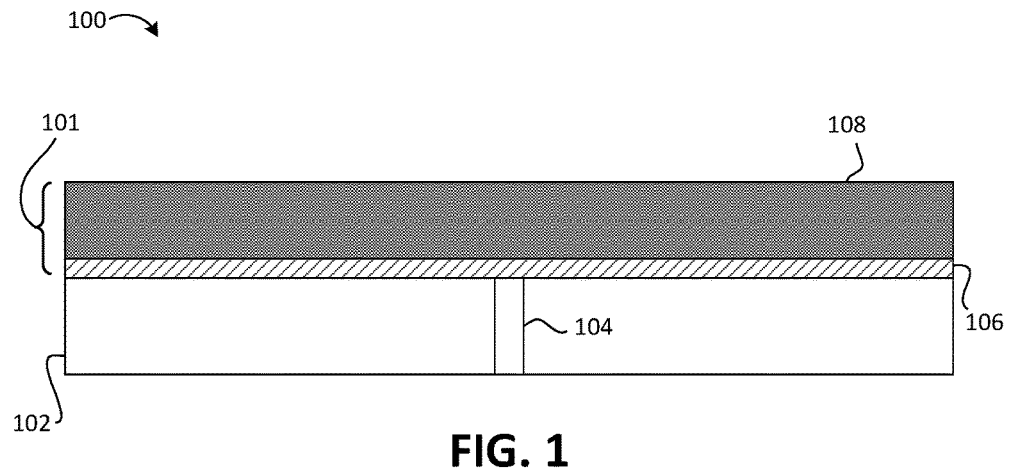
FIG. 1 shows a bond pad manufacturing process in accordance with aspects of the present invention.

FIG. 1 shows a bond pad manufacturing process in accordance with aspects of the present invention. As shown in FIG. 1, a semiconductor structure 100 may include bond pad 101 and via 104 formed in an interlevel dielectric material 102 connecting to bond pad 101. Interlevel dielectric 102 may be an oxide, such as $SiO_2$ and/or other dielectric material. Via 104 may be filled with copper and/or other conductive materials fabricated using conventional lithographic, etching, and deposition methods known to those of skill in the art. Bond pad 101 may include titanium nitride (TiN) layer 106 and Al—Cu layer 108. TiN layer 106 is provided to protect migration of copper from via 104 to Al—Cu layer 108. In embodiments, the layers 106 and 108 are formed by conventional deposition processes such as sputter deposition. For example, TiN layer 106 may be deposited on via 104 using a chemical vapor deposition (CVD) process and/or other conventional deposition process. Al—Cu layer 108 may be deposited on TiN layer 106 using a CVD process and/or other conventional deposition process. The thickness of Al—Cu layer 108 ranges from approximately 0.5 micrometers to 4 micrometers. The thickness of TiN layer 106 may range from approximately 5 nanometers to 100 nanometers and may have a preferred thickness of approximately 10 nanometers. In embodiments, Al—Cu layer 108 may include approximately 0.5% copper.

Figure 2:
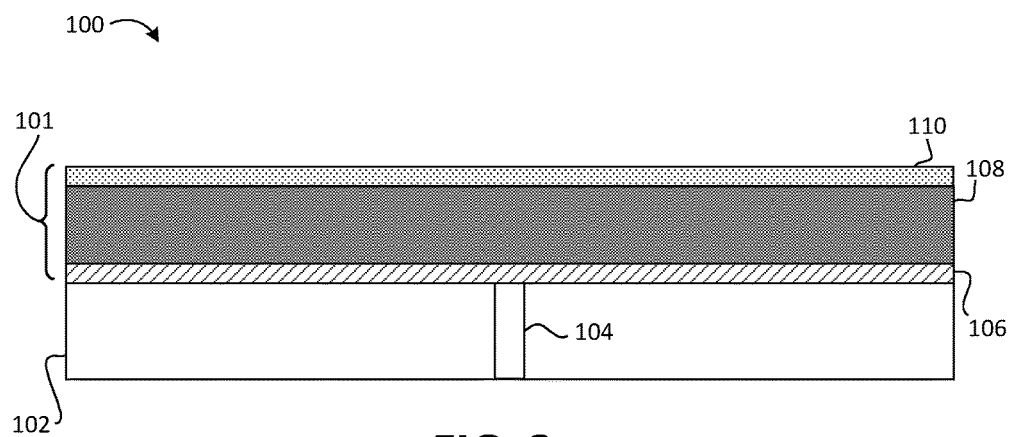
FIG. 2 shows a bond pad manufacturing process in accordance with aspects of the present invention.

Referring to FIG. 2, Al—Cr layer 110 may be deposited on Al—Cu layer 108, e.g., using a CVD process and/or other conventional deposition process. In embodiments, the thickness of Al—Cr layer 110 may range from approximately 10 nanometers to 100 nanometers and may have a preferred thickness of approximately 50 nanometers. In embodiments, Al—Cr layer 110 may include approximately 0.1% to 1% chromium, with approximately 0.5% chromium preferred. As should be understood by those of skill in the art, Al—Cr layer 110 does not suffer from galvanic corrosion. Further, Al—Cr layer 110 readily self-passivates by forming a thin passivation layer of $Al_2O_3$ at its surface. Advantageously, the passivation layer will thus prevent chromium etch-through during subsequent manufacturing steps, as described herein. Also, Al—Cr layer 110 prevents migration of the copper within underlying Al—Cu layer 108, thus preventing void formation. In this way, Al—Cr layer 110 acts as a protective layer for bond pad 101 to prevent corrosion and prevent copper from migrating to a top surface of bond pad 101.

Figure 3:
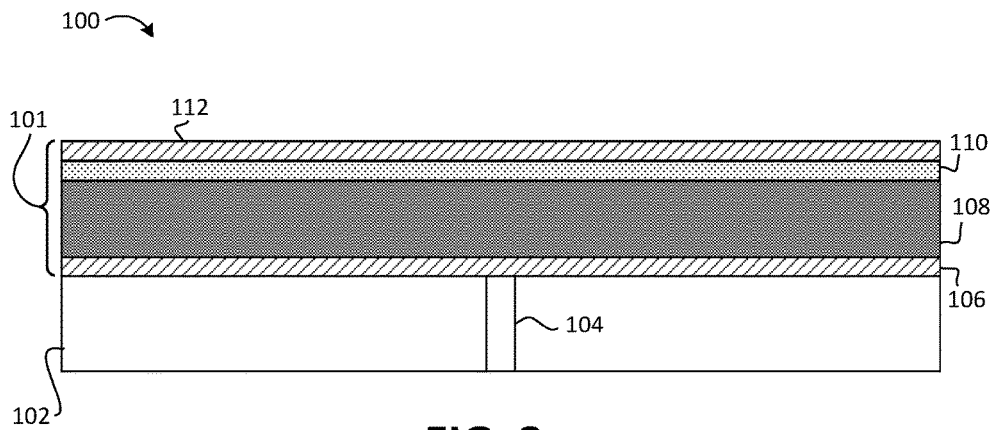
FIG. 3 shows a bond pad manufacturing process in accordance with aspects of the present invention.

Referring to FIG. 3, TiN layer 112 may be deposited on Al—Cr layer 110, e.g., using a CVD process and/or other conventional deposition process. In embodiments, the thickness TiN layer 112 may range from approximately 10 nanometers to 100 nanometers and may have a preferred thickness of approximately 25 nm. In embodiments, TiN layer 112 may be an anti-reflective coating to protect bond pad 101 from contaminants during subsequent processes.

Figure 4:
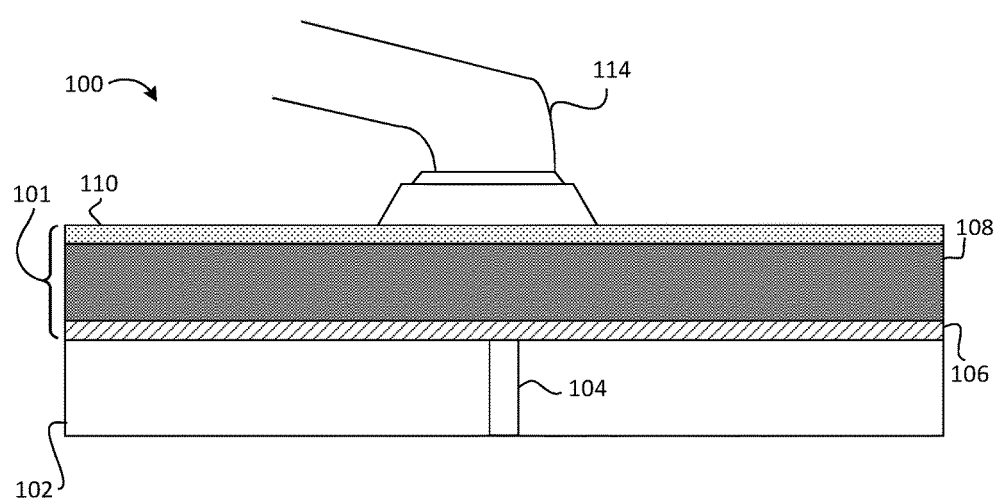
FIG. 4 shows a bond pad structure in accordance with aspects of the present invention.

Referring to FIG. 4, the TiN layer 112 may be removed during final passivation etch. A bond wire 114 is then attached directly to bond pad 101 upon removal of TiN layer 112. For example, bond wire 114 may be attached via a solder connection, such as a C4 connection process. As described herein, Al—Cr layer 110 acts as a protective layer for bond pad 101 to prevent corrosion and prevent copper from migrating to a top surface of bond pad 101 during subsequent fabrication processes. Thus, corrosion and migration of copper from Al—Cu layer 108 to a top surface of bond pad 101 may be prevented, thereby improving the reliability, conductive performance of bond pad 101, and/or bonding performance between bond wire 114 and with the bond pad 101.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method of manufacturing a bond pad structure comprising:

depositing a first titanium-nitride (TiN) layer directly over a dielectric layer;
  depositing an aluminum-copper (Al—Cu) layer directly over the first TiN layer;
  depositing an aluminum-chromium (Al—Cr) layer directly over the Al—Cu layer;
  depositing a second TiN layer directly over the Al—Cr layer;
  removing the second TiN layer; and
  attaching a bonding wire to a top surface of the Al—Cr layer after removing the second TiN layer.

2. The method of claim 1, further comprising forming a via within the dielectric layer.

3. The method of claim 1, wherein depositing the first TiN layer, the second TiN layer, the Al—Cu layer, or the Al—Cr layer is performed using a chemical vapor deposition (CVD) process.

4. The method of claim 1, wherein the removing the second TiN layer is by an etching process.

5. The method of claim 1, wherein the Al—Cu layer has approximately 0.5% copper.

6. The method of claim 5, wherein the Al—Cr layer has approximately 0.1% to 1% chromium.

7. The method of claim 2, wherein the via is filled with a conductive material in electrical contact with the first TiN layer.

8. The method of claim 1, wherein the Al—Cu layer is deposited across an entire width of the dielectric layer.

9. The method of claim 1, wherein the Al—Cr layer is deposited across an entirety of the Al—Cu layer.

10. The method of claim 7, wherein the via is connected to the bond pad structure.

11. The method of claim 1, wherein the Al—Cr layer has approximately 0.5% chromium.

12. The method of claim 1, wherein the thickness of the Al—Cu layer ranges from ranges from 0.5 micrometers to 4.0 micrometers.

13. The method of claim 1, wherein the thickness of the Al—Cr layer ranges from ranges from 10 nanometers to 100 nanometers.

14. The method of claim 9, wherein the Al—Cr layer is planar along an entirety of the Al—Cu layer.

15. The method of claim 8, wherein the Al—Cu layer is planar along an entirety of the dielectric layer.

16. The method of claim 1, wherein the Al—Cr layer self-passivates by forming a thin passivation layer of $Al_2O_3$.

17. The method of claim 1, wherein the second TiN layer has a thickness ranging from 10 nanometers to 100 nanometers.

18. The method of claim 17, wherein the second TiN layer is an antireflective coating.

19. The method of claim 1, wherein the second TiN layer is an antireflective coating.

* * * * *